United States Patent
Oliva

(10) Patent No.: US 7,063,259 B2
(45) Date of Patent: Jun. 20, 2006

(54) OPTICAL DEVICE FOR EMITTING A LASER LIGHT BEAM, OPTICAL READER COMPRISING SAID DEVICE AND PROTECTIVE/INSULATING PACKAGE FOR A LIGHT BEAM EMISSION SOURCE

(75) Inventor: Guido Maurizio Oliva, Rovigo (IT)

(73) Assignee: Datalogic S.p.A., Bologna (IT)

( * ) Notice: Subject to any disclaimer, the term of this patent is extended or adjusted under 35 U.S.C. 154(b) by 575 days.

(21) Appl. No.: 09/773,384

(22) Filed: Feb. 1, 2001

(65) Prior Publication Data

US 2002/0050517 A1    May 2, 2002

(30) Foreign Application Priority Data

Oct. 26, 2000    (EP) .................................. 00830707

(51) Int. Cl.
   *G06K 7/14*    (2006.01)
(52) U.S. Cl. ............. 235/454; 235/462.42; 235/462.43
(58) Field of Classification Search ................ 235/454, 235/462.01, 462.25, 462.35, 462.43, 462.45, 235/472.01, 462.42; 359/212, 213, 220, 359/224, 365, 366, 507, 508, 737
   See application file for complete search history.

(56) References Cited

U.S. PATENT DOCUMENTS

| | | | |
|---|---|---|---|
| 4,309,605 A | 1/1982 | Okabe | |
| 4,760,248 A * | 7/1988 | Swartz et al. | ........... 235/462.21 |
| 4,832,469 A | 5/1989 | Noguchi et al. | ............. 350/404 |
| 5,187,353 A * | 2/1993 | Metlitsky et al. | ....... 235/462.35 |
| 5,200,597 A * | 4/1993 | Eastman et al. | ............. 235/455 |
| 5,233,170 A * | 8/1993 | Metlitsky et al. | ....... 235/462.35 |
| 5,274,491 A * | 12/1993 | Collins et al. | ............... 359/200 |
| 5,283,802 A | 2/1994 | Hsiung | ........................ 372/107 |
| 5,386,105 A | 1/1995 | Quinn et al. | ................. 235/462 |

(Continued)

FOREIGN PATENT DOCUMENTS

EP    0 524 029    1/1993

(Continued)

OTHER PUBLICATIONS

Patent Abstracts of Japan vol. 006, No. 064 (E-103), Apr. 1982 & JP 57 004 188 (Ricoh Co Ltd), Jan. 1982.

(Continued)

*Primary Examiner*—Ahshik Kim
(74) *Attorney, Agent, or Firm*—Nixon & Vanderhye, P.C.

(57) ABSTRACT

An optical device which emits a laser light beam (3) comprises a laser light beam emission source (20)(for example, a semiconductor laser diode) including a source of the laser light beam housed in a package (6) provided with a light beam emission window (11). The emission window is shaped so as to be a diaphragm (12) which selects a predetermined portion of the light beam. The size of the window is smaller than the size of the light beam in a transversal cross section taken at the emission window. Moreover, the device comprises a lens (13) for focusing the portion of the light beam. The focusing lens can in turn be housed in the emission window and be itself a diaphragm. In particular, the lens is a Fresnel or diffractive lens.

37 Claims, 5 Drawing Sheets

U.S. PATENT DOCUMENTS

| | | | |
|---|---|---|---|
| 5,440,111 A * | 8/1995 | Eastman et al. | 235/462.36 |
| 5,682,029 A * | 10/1997 | Dvorkis et al. | 235/472.01 |
| 5,745,176 A * | 4/1998 | Lebens | 348/370 |
| 5,796,087 A | 8/1998 | Hazama | 235/462 |
| 5,805,362 A * | 9/1998 | Hayes | 359/819 |
| 5,811,778 A * | 9/1998 | Itou et al. | 235/462.01 |
| 5,864,128 A * | 1/1999 | Plesko | 307/119 |
| 5,969,323 A * | 10/1999 | Gurevich et al. | 235/462.06 |
| 6,024,283 A * | 2/2000 | Campanelli et al. | 235/462.32 |
| 6,039,254 A * | 3/2000 | Froese-Peeck et al. | 235/462.32 |

FOREIGN PATENT DOCUMENTS

| | | |
|---|---|---|
| EP | 0 566 341 | 10/1993 |
| EP | 0 582 958 | 2/1994 |
| EP | 0 584 830 | 3/1994 |
| JP | 10-105636 | 4/1998 |

OTHER PUBLICATIONS

Patent Abstracts of Japan vol. 008, No. 183 (P296), Aug. 1984 & JP 59 075372 (Casio Keisanki KK), Apr. 1984.

* cited by examiner

OPTICAL DEVICE FOR EMITTING A LASER LIGHT BEAM, OPTICAL READER COMPRISING SAID DEVICE AND PROTECTIVE/INSULATING PACKAGE FOR A LIGHT BEAM EMISSION SOURCE

BACKGROUND

Field of the Invention

The present invention relates to an optical device for emitting a laser light beam, and to an optical reader comprising the device.

The invention also relates to a protective and/or insulating package for a light beam emission source. The package is especially adapted to be used in the device and/or in the optical reader of the present invention.

The invention also relates to an optical device for emitting a light beam and for the simultaneous collection of the light diffused by an illuminated optical code, and to an optical reader comprising such emission/reception device.

Preferably but not exclusively, the emission device, the package or the emission/reception device of the invention are adapted to be used, in particular, in a small-size and low-cost optical reader, such as for example a portable optical code reader.

RELATED ART AND OTHER CONSIDERATIONS

In the present description and following claims, the term "optical reader" refers to any device capable of acquiring coded information relating to an object (for example distance, volume, size, or its identification data) through the acquisition and the processing of a luminous signal diffused by it. The term "optical code", on the other hand, refers to a code (such as for example, a bar code, a bi-dimensional code or the like) capable of univocally identifying the objects on which it is provided.

For exemplificative purposes and in order to make the following discussion clearer, in the following description explicit reference shall be made to optical code readers.]

In its simplest embodiment, an optical code reader comprises a source for the emission of a luminous signal intended to illuminate an object, photo-detecting means intended to collect the luminous signal diffused by the illuminated object and generate an electrical signal proportional thereto, and processing means intended to elaborate and process the generated electrical signal, so as to acquire the desired information. Downstream of the emission source there can be a focusing lens which focuses, at a predetermined distance, the luminous signal emitted by the emission source.

As known, particularly in small-size and low-cost optical readers, there is the need of using low-priced and small devices for emitting a focused light beam and/or focusing devices. For this purpose, the use or semiconductor laser diodes as emission source is popular.

A semiconductor laser diode essentially comprises a chip of semiconductor material (with size typically comprised in the ranges 200–300 μm in depth, 250–300 μm in width and 100–150 μm in height) Due to its extreme sensitivity to atmospheric agents and to electrostatic charges, the chip is properly fixed on a special support element and housed into a special package which insulates and/or protects it from the external environment. The package essentially comprises a metal capsule having a substantially cylindrical shape. At a first end thereof, the capsule is provided with a base surface comprising seats intended to receive respective electric connection elements for power-supplying the diode. At an opposed end, the package is provided with a service surface comprising a glass window to allow the emission of the light beam generated by the diode. The chip support element also functions as heat sink for the diode during operation.

Typically, the windows of the semiconductor laser diodes are manufactured in such a way as to allow the exit of the highest possible quantity of luminous energy, thus exploiting all the luminous power of the laser without reducing its efficiency. Thus, typically the windows are of relatively large size.

Whereas, on the one hand, the use of a semiconductor laser diode advantageously reduces costs and size of the emission and/or focusing device (and thus, of the reader), on the other hand it has a disadvantage of not allowing a reliable reading of optical codes, even when the codes are situated a short distance from the reader. This is essentially due to the impossibility of generating a light beam which should remain collimated and focused for a predetermined, even small, distance range.

Therefore, in optical readers there is the need of producing a focused laser beam also for small depths of field, so as to allow a reliable reading of optical codes arranged even at a short distance. This implies the need that the spot of the laser at the focal point should have a diameter substantially equal to or slightly greater (1.5 times) than the size of the module (that is, of the smallest element of the code) of optical information that must be read, and that the spot should remain such for a predetermined propagation distance.

A method known in the art for obtaining a sufficient depth of field manipulates the laser beam exiting from the laser diode using an aperture (diaphragm) intended to let only a central portion of the emitted laser beam pass.

In fact, it is known that whenever a luminous wave front passes through an aperture of any shape, such as to truncate the wave front, the distribution of the luminous intensity downstream of the same aperture is determined by the diffraction. Such distribution is called a diffraction pattern and corresponds to the spot of the laser beam at the focal point. The shape and size of the diffraction pattern depend on the size of the aperture, on the distance from which the pattern is observed, and from the radius of curvature of the incident wave front (if the incident wave front is plane, the radius is infinite).

The shape of the diffraction pattern depends on a parameter which contains all of the possible variants indicated above. Such parameter is known as the Fresnel number, and is defined by the following relation:

$$N = a^2/(\lambda \cdot Z)$$

wherein a is the semi-dimension of the aperture in the direction in which the spot diameter is measured, $\lambda$ is the wavelength, and Z is the effective observation distance. In in the case of a plane wave front, Z is the actual observation distance; in the case of a curved wave front, the effective observation distance differs from the actual observation distance by the radius of curvature of the wave front.

In substance, the main effects of the diffraction from an aperture are (1) increasing the size of the laser beam at the focal point, (2) maintaining the spot collimated and substantially with the same profile for a greater distance interval, and (3) giving a more suitable shape to the spot for an optional reading of optical codes (in particular, a spot is obtained having an intense and focused central portion). In this way, there is the advantage of increasing the reading field (depth of field).

Often, it is actually desirable to be able to read coded information on optical supports placed into a very wide range of distances. That is, the reader must have a high reading field (either depth of focus, or depth of field). Such need can occur, for example, in handling plants for distributing and sorting objects identifiable through optical codes, in which the objects can have also very different heights from one another. In this case, the laser spot must remain focused for a propagation distance as wide as possible.

A method known in the art for obtaining a high depth of field manipulates the laser beam exiting from the laser diode, using the combined effects of the focusing device (lens) and of an aperture (diaphragm) which lets only a central portion of the emitted laser beam pass. In substance, it has been experimentally proven that adding up the effects of the focusing produced by the lens and of the diffraction produced by the aperture, it is possible to obtain a focused light beam with particularly high depth of field.

By combining the focusing effect of the laser beam produced by the focusing lens, and that of diffraction due to the interposition of an aperture between the lens and the focal point (or between the emission source and the lens), a spot whose shape is the diffraction pattern corresponding to the aperture, scaled in size by a factor depending on the magnification or reduction operated by the lens, is obtained at the focal point and in its surroundings. This allows reliable readings at different and relevant distances.

Although the introduction of diffraction in a light beam through an aperture produces an increase of the light beam spot size at the focal point and a reduction of the luminous efficiency of the reader, it is particularly advantageous when on the one hand, an excessive focusing of the spot is to be prevented (for example, so as not to detect the support imperfections) and on the other hand, the reading field of the reader it to be maximized.

In the prior art there are known laser readers which take advantage of the combined effect of the focusing and of the diffraction of a laser beam for the purpose of increasing the reading field of the same reader. For example, the European patent application EP 367 299 describes a laser diode scanning device for reading bar codes comprising a semiconductor laser diode associated to a diaphragm and to a focusing lens. In such a device, particular attention must be given in the relative arrangement of the diaphragm and of the focusing lens for the purpose of obtaining the desired focusing and diffraction effects and to allow a reliable reading. In fact, it is necessary to provide a suitable mechanical coupling, support and alignment system between diode, diaphragm and lens. This unavoidably implies high costs and high assembly times. Moreover, the presence of several individual optical components (diode, diaphragm, focusing lens), each to be arranged in a suitable way with respect to the others, makes an excessive miniaturization of the device impossible.

The technical problem at the basis of the present invention is that of providing a device for emitting a light beam which should, on the one hand, be constructively simple, easy to mount, low-priced and small-sized, so as to be mounted, for example, into small-sized and low-priced optical readers (such as, for example, portable readers), and on the other hand should have all the advantages of introducing diffraction in the emission laser beam (in particular, an increase of the depth of field of the device and/or reader).

SUMMARY

Thus, in a first aspect thereof, the present invention relates to an optical device for emitting a laser light beam. The optical device comprises a laser light beam emission source including a package and means for generating the laser light beam housed into said package. The package is provided with a laser light beam emission window and has a diaphragm which selects a central portion of the laser light beam.

Advantageously, the device of the present invention is provided with a diaphragm intended to introduce diffraction in the laser light beam generated by the emission source, so as to obtain an increase of its depth of field. Even more advantageously, the diaphragm is structurally associated to the protective and/or insulating package of the luminous source, and it is part of the package. This allows a significant reduction of the overall dimensions of the emitting device and thus, of the optical reader wherein it is intended to be mounted. Moreover, the device of the invention is particularly simple from the construction point of view, and it provides for the use of widely used optical elements, thereby implying a reduction of the production costs.

Thus, according to the present invention it is possible to generate, directly at the outlet of the package of the emission source, a laser light beam with assigned cross section and sufficient depth of field. Considering the precision with which modern assembly methods arrange the light source with respect to the package window, it is possible to obtain a laser light beam at the output of the package, which is already ready to be optionally focused without further need of being truncated downstream of the package. The disadvantage mentioned above with reference to the devices of the prior art—associated in particular to the need of taking care of the optical alignment of the diaphragm with the emission window—is thus removed.

The above advantages are particularly evident when the laser light beam emission source is a semiconductor laser diode, although it is possible to achieve the same advantages with other type of sources comprising special protective packages provided with a window for the emission of the light beam.

In a first embodiment of the device of the present invention, the diaphragm is directly associated (e.g., secured) to the package at the laser light beam emission window. More preferably, the diaphragm is directly housed in the laser light beam emission window.

In a particularly advantageous embodiment of the device of the present invention, the laser light beam emission window is shaped to serve as a diaphragm. Advantageously, the emission source is thus implemented with smaller size and shape than that of the laser light beam in a transversal cross section taken at said laser light beam emission window so as to impart assigned shape and size to said beam, concurrently introducing diffraction. According to the present invention, it is thus sufficient to suitably shape the package window to obtain the desired diffraction effects. In other words, a single opto-electronic element (package) is realised, having an emission diaphragm/window with predetermined shape and size.

As already mentioned, the device of the present invention is preferably intended to be mounted into an optical reader, for example an optical code reader. The optional optical code reading can be carried out prevalently along a preferential direction or along more directions (omni-directional reading). According to the present invention, for the purpose of allowing a reliable reading of codes prevalently oriented orthogonally to the reading (or scanning) direction, the emission window defines an aperture having a Fresnel number smaller than 2 (preferably, smaller than 1.2) along the reading direction and smaller than 6 in orthogonal direction. Even more preferably, for the purpose of carrying out reliable readings along all directions, independently of the code orientation with respect to the reader, the aperture defines a Fresnel number smaller than 2 along all directions.

As already mentioned, the shape of the diffraction pattern (spot) generated by an aperture is a function of the Fresnel number defined by the following relation:

$$N = a^2/(\lambda \cdot Z)$$

where a is the semi-dimension of the aperture in the direction in which the spot diameter is measured, $\lambda$ is the wavelength, and Z is the effective distance of observation. By suitably selecting the Fresnel number, it is therefore possible to select each time the shape of the spot laser that allows to obtain a reliable reading.

According to a particularly preferred embodiment thereof, the device of the present invention further comprises a focusing lens. It is thus possible to obtain all the advantages described above arising from the combination of the effects of the focusing and of the diffraction.

According to an embodiment of the device of the present invention, the focusing lens is directly associated to the package at said light beam emission window. For the purpose of guaranteeing a greater safety in the stable coupling between focusing lens and laser light beam emission window, the device of the invention preferably further comprises an adhesive between the focusing lens and the emission window.

In a particularly advantageous embodiment of the device of the present invention, the focusing lens is housed in the laser light beam emission window, and is itself the diaphragm. Preferably, the focusing lens is a Fresnel or diffractive lens. In fact, it is advantageously possible to realize—through optical lithography methods—very small and thin Fresnel or diffractive lenses, which can be produced in plastic through repetition, at an extremely reasonable price. Such lens is itself the window/diaphragm of the package of the laser light beam emission source and allows to obtain all the advantages arising from the combination of the diffraction and focusing effects described above.

In any case, independently of the chosen type of embodiment, the integration of the focusing lens in the package of the emission source allows to further reduce the overall size of the optical reader wherein the device of the invention is intended to be mounted. Moreover, the disadvantage mentioned above with reference to the devices of the prior art, in particular that one associated to the need of taking care of the optical alignment of the focusing lens with the emission source and with the diaphragm, is thus eliminated.

In an alternative embodiment of the device of the present invention, the package has a substantially tubular shape with a longitudinal axis Z and wherein the light beam emission source is arranged into the package so that the emitted light beam propagates along a substantially perpendicular direction with respect to the longitudinal axis Z. This is particularly advantageous if, for example, due to requirements of smaller overall dimensions, it is necessary that the light beam emerges at a very low height with respect to a plane for the assembly of the package, or when, due to assembly requirements, the beam must propagate in parallel with respect to the surface on which all opto-electronic components of the emission source are mounted. Such embodiment is advantageously compatible with all the embodiments described above.

In a particularly preferred embodiment of the device of the invention, the package has a cavity divided into two optically separate portions, respectively a first cavity portion and a second cavity portion, intended to respectively house said means for generating a light beam, and photo-receiving means for detecting a luminous signal diffused by an optical code illuminated by said means for generating a light beam. On a first wall of said first cavity portion there is formed the emission window, and on a second wall of the second cavity portion there is formed a window for collecting the light beam diffused by the illuminated optical code. The first and second walls are orthogonally oriented with respect to one another. A single emission/detection device is thus advantageously implemented, which limits to the utmost the overall dimensions of the reader in which said device is intended to be mounted.

A package of the type described above allows to take advantage of the typical arrangement of the components in a non-retroreflective scan reader. As known, in fact, in a scan reader of the above type, the laser beam typically impinges at 45° on an oscillating or rotating mirror which generates a scan in orthogonal direction with respect to the laser beam emission direction. The laser beam then illuminates the optical code, and the light diffused by it is collected by a photodiode, whose surface must face the plane on which the code lies (that is, the surface is substantially parallel to the code plane), so as to face toward the code the maximum collecting surface.

In a second aspect thereof, the invention relates to an optical reader comprising a laser light beam emission device for illuminating an optical code, means for generating at least one scan on said optical code, photo-detecting means which collects a luminous signal diffused by the illuminated optical code and generates an electrical signal proportional thereto, and processing means which processes the electrical signal. In its second aspect, the optical reader has a laser light beam emission device which is of the type described above.

Such reader is of a small size and low-priced device, and allows all the advantages mentioned above with reference to the emission device of the present invention.

In a third aspect thereof, the invention relates to a protective and/or insulating package for a light beam emission source. The package has a cavity which houses means for generating a light beam and a wall provided with a window intended to allow the emission of the light beam. The package has a diaphragm which selects a central portion of the light beam. Such package is particularly suitable to be mounted into a device and/or a reader of the type described above, thus allowing the achievement of the above mentioned advantages.

Preferably, the emission source is a semiconductor laser diode.

In a first embodiment of the package of the invention, said diaphragm is associated to the wall at the light beam emission window. Preferably, the diaphragm is housed in the light beam emission window.

In the preferred embodiment of the package of the present invention, the emission window is shaped in such way as to serve as the diaphragm.

According to a particularly preferred embodiment, the package of the invention can further comprise a focusing lens.

According to a further embodiment of the package of the present invention, the focusing lens is directly associated to the package at the light beam emission window. Preferably, in this case, an adhesive is interposed between the focusing lens and the emission window.

Preferably, the focusing lens is housed in the light beam emission window and serves itself as the diaphragm. Even more preferably, the focusing lens is a Fresnel or diffractive lens.

According to an alternative embodiment, in the package of the present invention a longitudinal axis Z is defined and the means for generating the light beam is intended to be arranged into the cavity so that the emitted light beam propagates along a substantially perpendicular direction with respect to the longitudinal axis Z.

In a particularly preferred embodiment of the package of the invention, the cavity is divided into two optically separate portions, respectively first and second portion, intended to respectively house the means for generating a light beam, and photo-receiving means for detecting a luminous signal diffused by an optical code illuminated by the means for generating a light beam. On a first wall of the first cavity portion there is formed the emission window, and on a second wall of the second cavity portion there is formed a window for collecting the light beam diffused by the illuminated optical code. The first wall and the second wall are orthogonally oriented with respect to one another.

Each of the above embodiments of the package of the invention provides the same advantages mentioned above with reference to the corresponding embodiment of the emission device described above.

In a fourth aspect thereof, the present invention relates to an optical device for emitting/detecting a luminous signal. The optical device comprises a light beam emission source including a package, and means for generating the light beam housed in a first portion of said package wherein there is formed a light beam emission window. The optical device further comprises photo-receiving means which detects a luminous signal diffused by an optical code illuminated by the emission source. The photo-receiving means is housed into a second portion of the package which is optically separate with respect to the first portion. The second portion is provided with a window for collecting the luminous signal diffused by the illuminated optical code.

It is thus possible to realize a single emission/detection device which limits to the utmost the overall dimensions of the reader in which the device is intended to be mounted. As already mentioned before with reference to the emission device described above, the emission/detection device of the present invention takes advantage of the typical arrangement of the components in a non-retroreflective scan reader.

Preferably, the emission source comprises a semiconductor laser diode.

Even more preferably, the emission and collecting windows are formed on respective first and second walls of the package, orthogonally oriented with respect to one another, so as to prevent part of the emitted light from directly reaching the photo-receiving means.

In the preferred embodiment thereof, the device of the invention further comprises at least one diaphragm which selects a central portion of the light beam.

In a first embodiment of the device of the invention, the diaphragm is directly associated to the package at the light beam emission window. Preferably, the diaphragm is housed directly into the light beam emission window.

In the preferred embodiment of the device of the invention, the light beam emission window is shaped so as to serve itself as the diaphragm. Preferably, the light beam emission window is smaller than the light beam in a transversal cross section taken at the laser light beam emission window.

Preferably, the emission window defines an aperture having a Fresnel number smaller than 2 (more preferably, smaller than 1.2) along a predetermined reading direction, and smaller than 2 along an orthogonal direction with respect to said reading direction.

According to a preferred embodiment thereof, the device of the invention also comprises a focusing lens. The focusing lens can be directly associated to the package at the light beam emission window (in this case, preferably, the device would also comprise an adhesive interposed between the focusing lens and the light beam emission window) or, preferably, it can be housed in the light beam emission window and be itself the diaphragm (in this case, preferably, it would be a Fresnel or diffractive lens).

Each of the two embodiments of the emission/detection device of the invention obtains the same advantages mentioned above with reference to the corresponding embodiment of the laser light beam emission device described above.

Preferably, the emission/detection device of the present invention further comprises a wall made of an optically opaque material interposed between the first and second portions of the package to allow optical insulation between the portions.

In a fifth aspect thereof, the present invention relates to an optical reader comprising a light beam emission device for illuminating an optical code, means for generating a scan on an optical code, a device for detecting the luminous signal diffused by the illuminated optical code and for generating an electrical signal proportional thereto, and means for elaborating and processing the electrical signal. The optical reader is characterised in that the emission and detection devices consist of a single emission/detection device of the type described above.

In particular, it is a non-retroreflective scan reader having, advantageously, small size and a low price. Such a reader allows all the advantages mentioned above with reference to the emission and/or emission/detection device of the present invention.

In a sixth aspect thereof, the present invention relates to a protective and/or insulating package for a light beam emission source, comprising a first cavity portion which houses means for generating a light beam. The package is provided with a first wall wherein there is formed a window which allows emission of the light beam. The package comprises a second cavity portion which houses photo-receiving means for detecting a luminous signal diffused by an optical code illuminated by the means for generating a light beam. The package is provided with a second wall wherein there is formed a window for collecting the luminous signal diffused by the illuminated optical code. The second cavity portion is optically separate with respect to the first cavity portion. Such package is particularly suitable to be mounted into an emission/detection device and/or optical reader of the type described above, thus achieving all the advantages mentioned above.

Preferably, the package comprises all the structural and/or functional features mentioned above with reference to the emission/detection device of the present invention.

BRIEF DESCRIPTION OF THE DRAWINGS

Further features and advantages of the present invention will appear more clearly from the following detailed description of some preferred embodiments, made with reference to the attached drawings. In the drawings.

DETAILED DESCRIPTION

Figure 3:
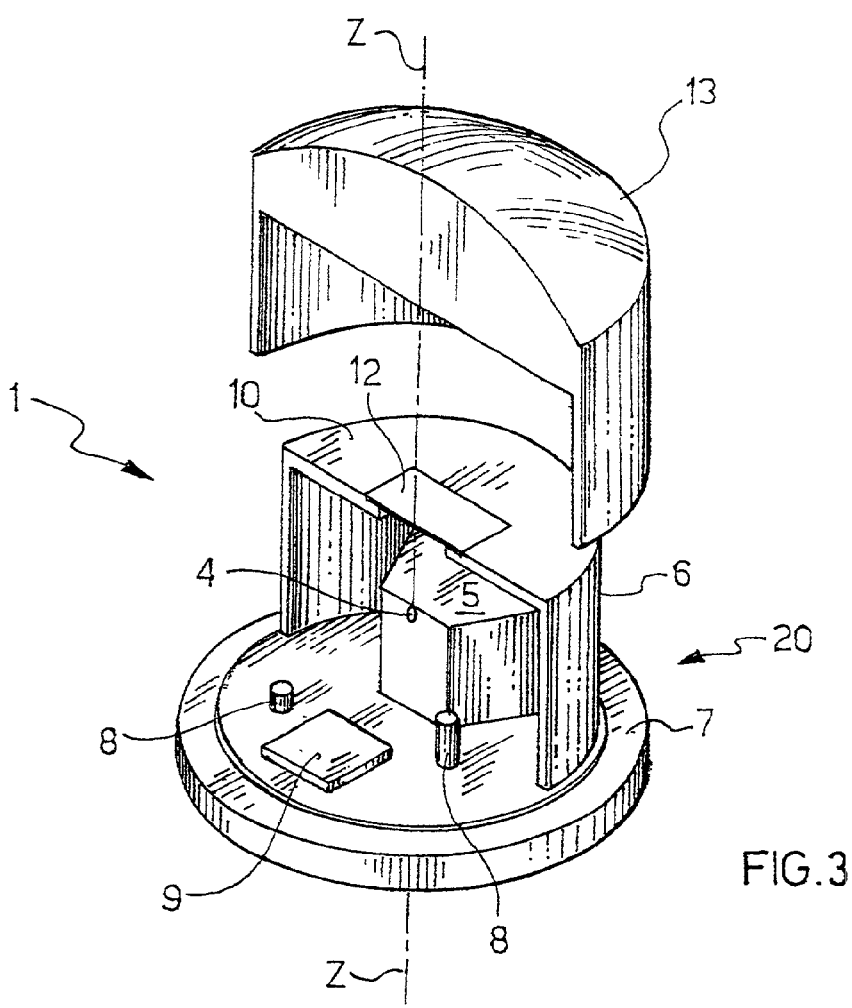
FIG. 3 shows a schematic sectioned view of an emission device of a laser light beam according to the present invention, including the optical element of FIG. 2.
Figure 4:
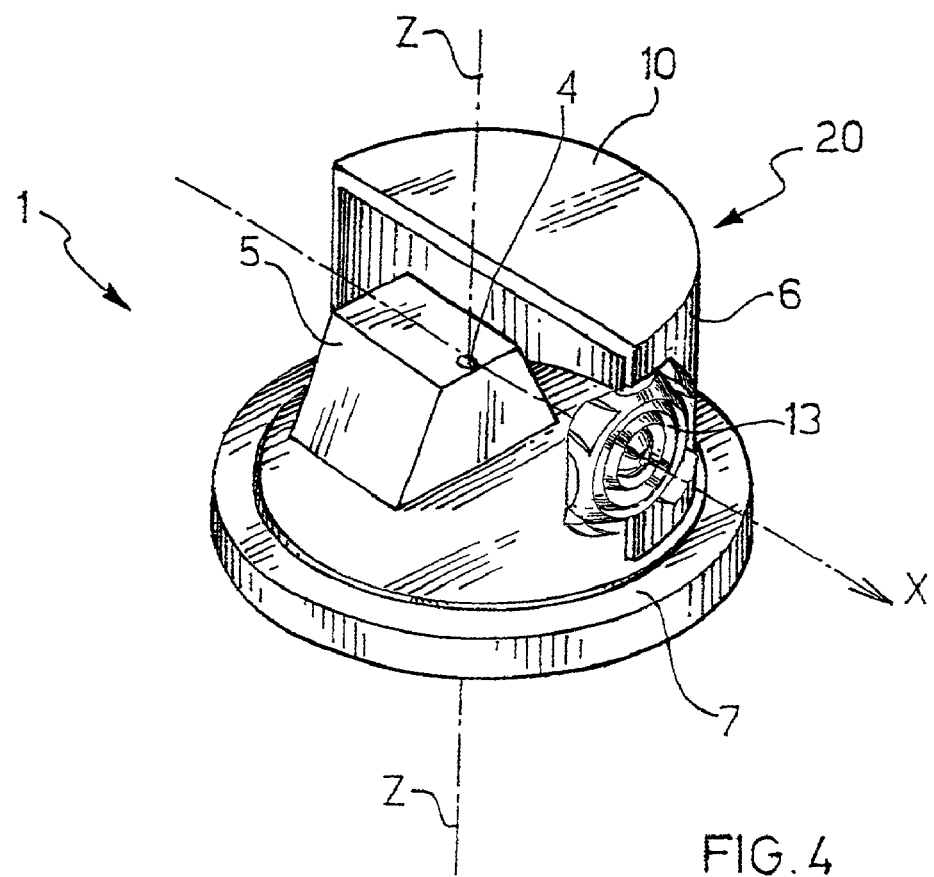
FIG. 4 shows a schematic sectioned view of an alternative embodiment of the device of FIG. 3.

In FIG. 3, and FIG. 4, reference numeral 1 refers to an optical device for the emission of a laser light beam, according to the present invention. Device 1 is intended to be used in an optical reader of small size and moderate price (for example, a portable reader of optical codes) for the purpose of increasing the depth of field of the light beam, so as to allow the reading of information placed at different distances (also small) with respect to the same reader.

Figure 1:
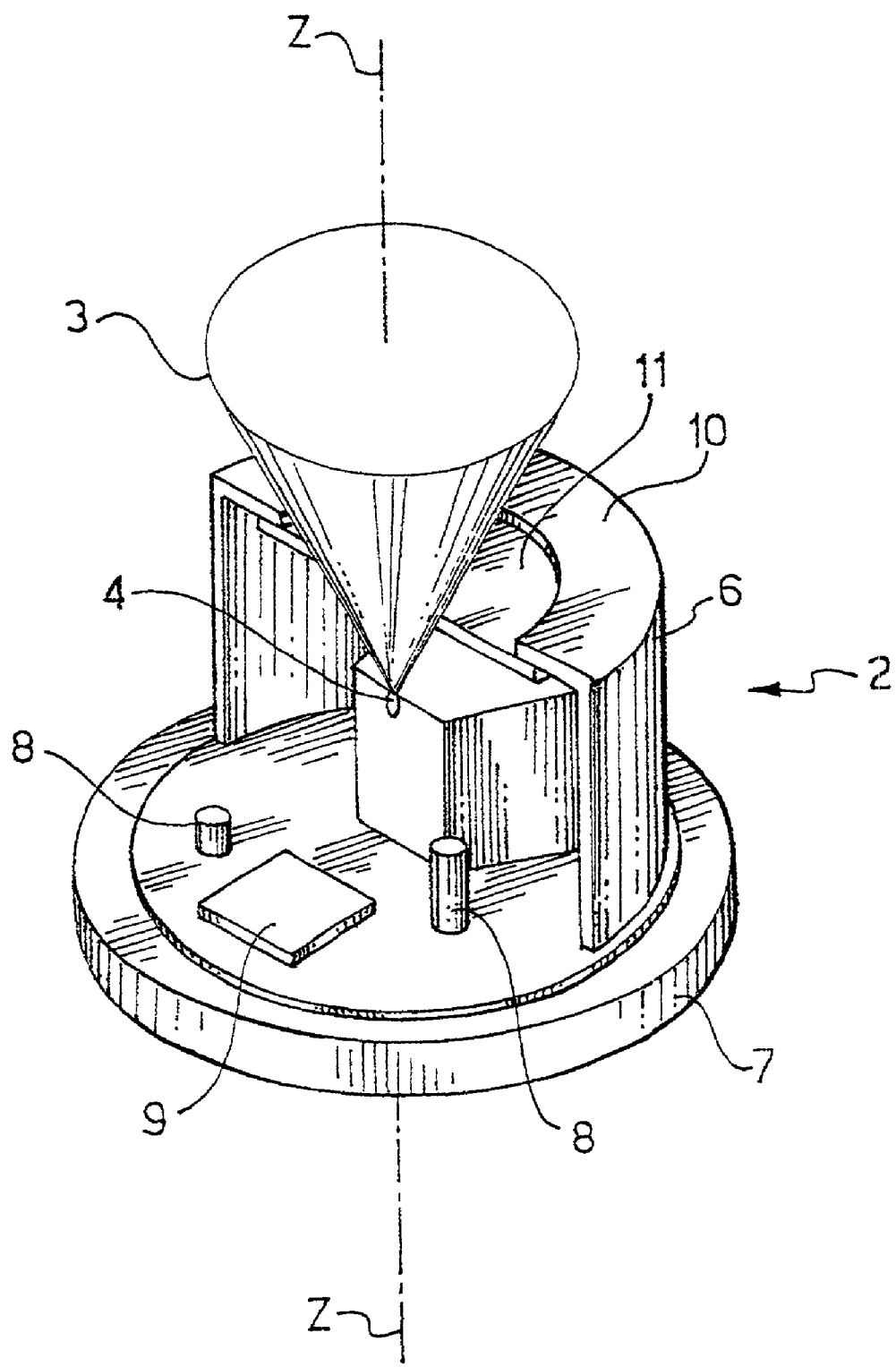
FIG. 1 shows a perspective schematic and sectioned view of a conventional light beam emission source (in particular, it is a conventional semiconductor laser diode)

As in the devices of the prior art, illustrated (for example) in FIG. 1, device 1 comprises an emission source 20, for example a semiconductor laser diode, intended to emit a light beam, for example a laser beam. The laser beam exits from diode 20, and can have elliptical cross section, as in the case of an edge-emitting laser, or a circular cross section, as in the case of a VCSEL laser (vertical cavity Surface Emitting Laser).

In the following description, explicit reference shall be made to a semiconductor laser diode as emission source of a laser light beam. However, the person skilled in the art shall understand that what said is similarly applicable to different kinds of emission sources, comprising in any case a protective package provided with a light beam emission window.

For the purpose of clearly describing the device of the present invention and clarifying the differences thereof relative to the devices of the prior art, reference shall now be made to FIG. 1, which shows a semiconductor laser diode 2 of the conventional type.

Typically, a conventional laser diode 2 essentially comprises a chip 4 of semiconductor material fastened on a special support element 5 and housed into a cavity defined into a special metal package (or capsule) 6 for protection and/insulation from the external environment. The package 6 illustrated in FIG. 1 has a substantially tubular shape wherein there is defined a longitudinal axis Z. At a first end thereof, the package 6 comprises a base surface 7 on which there are provided elements 8 (commonly indicated with the term "rheophores" or "pins") of electrical connection for feeding the diode 2 and a monitor photodiode 9. At an opposed end thereof, the package 6 comprises a service surface or wall 10 wherein there is formed a glass window 11 intended to allow the output of the light beam 3 generated by chip 4.

In conventional focusing devices and/or optical readers, downstream of the laser diode 2 there are generally provided a diaphragm (intended to select a central portion of the light beam 3) and a focusing lens (intended to focus the light beam 3 at a predetermined reading distance).

Figure 2:
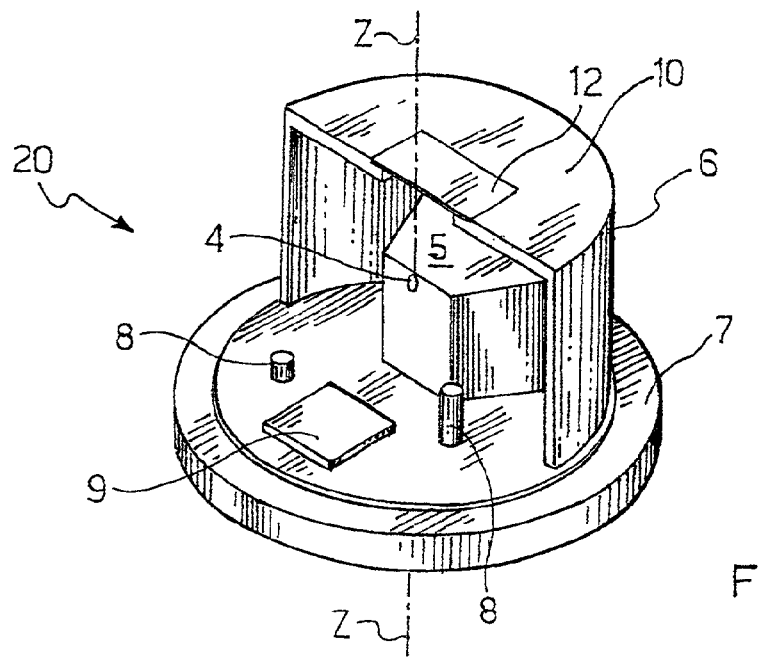
FIG. 2 shows a perspective, schematic and sectioned view of a light beam emission source according to the present invention (in particular, it is a semiconductor laser diode modified according to the present invention)

Reference shall now be made to FIG. 2, which shows a modified semiconductor laser diode 20, which is an example of an optical element for emitting a light beam implemented according to the present invention. Optical element 20 is in turn intended to be mounted in the laser light beam emission device 1 according to the present invention in the manner shown in FIG. 3 Fig. and FIG. 4.

From FIG. 2 it can be seen that the laser diode 20 of the present invention is similar to the conventional laser diode 2 described above and illustrated in FIG. 1, except at the service surface 10 of package 6. Thus, the structural elements of the laser diode 20 of the present invention that are identical to those described above with reference to the laser diode 2 of the prior art are indicated with the same reference numerals. By contrast, the different and/or modified structural elements are indicated with a different reference numeral.

According to a first preferred embodiment of the device of the present invention, shown in FIG. 2 and FIG. 3, the window for the emission of the light beam 3 is shaped so as to be itself a diaphragm 12. In particular, the size and shape of window 12 are smaller than the size of the light beam 3 in a transversal cross section taken at the window itself, so as to impart an assigned size and shape to the beam 3, concurrently introducing diffraction. Thus, diaphragm 12 is an integral part of the laser diode 20. More particularly, diaphragm 12 is integral part of package 6, forming with the latter a single optical element wherein a single window/diaphragm component 12 is realised.

Preferably, the window/diaphragm 12 defines in package 6 an aperture having a Fresnel number smaller than 2 (more preferably, smaller than 1.2) along the reading direction, and a Fresnel number smaller than 6 (more preferably, smaller than 2) in orthogonal direction. In particular, for the purpose of carrying out reliable readings along all directions, independently of the orientation of the code with respect to the reader, the aperture most preferably defines a Fresnel number smaller than 2 along all directions.

In an alternative, unillustrated, and less preferred embodiment of the device and/or of the optical element of the present invention, instead of consisting of the emission window, the diaphragm is directly associated (e.g., directly secured and essentially contacting) to the package at the window for the emission of the light beam (for example through the interposition of an adhesive), so as to define as a whole an aperture with a desired shape and size. In a second alternative embodiment (also not shown), diaphragm 12 is directly housed in the window 11.

Figure 5:
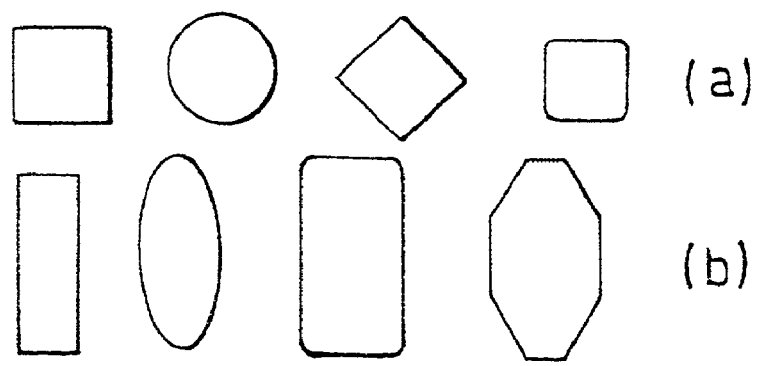
FIG. 5 schematically shows various types of diaphragms usable, respectively in the optical element of FIG. 2 and/or in the device of FIG. 3.

Independently of the specific embodiment of the device and/or of the optical element of the present invention, the shape of diaphragm 12 can be chosen on the basis of the specific use provided for the device and/or reader in which said device and/or optical elements is intended to be mounted. For example, as already mentioned, the reading of optical codes can be of the omni-directional type, or it can occur prevalently along a preferential direction. In the first case (omni-directional type), it is advantageous to use a diaphragm of symmetrical shape. Examples of symmetrical shapes are circular or square or rhomboidal, or one of these shapes differently bevelled as illustrated by the row of shapes shown in FIG. 5(a). On the other hand, in the second case (along a preferential direction) it is advantageous to use an elongated diaphragm in the orthogonal direction with respect to the direction of reading. Examples of elongated shapes include elliptical or rectangular or rhomboidal shapes or one of these shapes differently bevelled as illustrated by the row of shapes shown in FIG. 5(b).

Device 1 (and/or the optical element 20) of the invention further comprises a focusing lens 13 which serves to focus the truncated beam portion 3 (see FIG. 3). Lens 13 is generally made of a plastic material transparent to the luminous radiation. However, any other material optically transparent and printable or shapeable in the desired shape can be used for lens 13.

Lens 13 can be associated to and aligned with package 6 of the laser diode 20 according to any one of the modes described in the European patent application no. 99830677.3 by the same Applicant, and shown in FIG. 1, FIG. 2, and FIG. 3 of the same application, whose description is herein incorporated by reference. According to such modes, the lens 13 is arranged almost in contact with the window/diaphragm 12.

In an alternative embodiment of the device of the present invention, the focusing lens 13 is directly associated to the package 6 at the window/diaphragm 12. In this case, the device comprises an adhesive interposed between the window/diaphragm 12 and the lens 13, for the purpose of firmly associating the lens to package 6 of the laser diode 2.

In a particularly preferred embodiment of device 1 and/or of the optical element 20 of the present invention, the focusing lens 13 is an integral part of the package 6 and constitutes the window for the emission of the light beam 3. Moreover, its shape and size are such as to also constitute the diaphragm, thus forming a window/diaphragm/lens (see, in particular, window/diaphragm/lens 13 shown in FIG. 4). In particular, the focusing lens 13 is a Fresnel or diffractive lens (manufactured by diffractive technology).

In a further alternative embodiment of the device of the present invention shown in FIG. 4, the laser diode 2 is arranged into the package 6 so that the emitted light beam 3 propagates along a direction x that is substantially perpendicular to the longitudinal axis Z of package 6. Also in the embodiment of FIG. 4, the diaphragm can be associated to the package 6 at the emission window, or housed into it, or (preferably) the diaphragm can comprise the emission window suitably sized and shaped, as described above. The same applies also for the focusing lens 13, i.e., the focusing lens 13 can be associated to the package 6 at the window/diaphragm, or housed into the window/diaphragm and act itself as diaphragm, as described above.

Device 1 (and/or the optical element 20) of the present invention is particularly suitable for being mounted within an optical reader intended to acquire identification data of an illuminated object (not shown). Such a reader also comprises means intended to generate a scan on the optical code to be read, photo-detecting means intended to collect a luminous signal diffused by the illuminated optical code and to generate an electrical signal proportional thereto, and processing means intended to elaborate and process the electrical signal. In the specific case of an optical code reader, the processing means comprises an analogue/digital converter and a decoder.

During operation, with particular reference to FIG. 3, chip 4 of the laser diode 20 generates a laser beam (unillustrated in FIG. 3) which is suitably truncated by window/diaphragm 12 and then focused by the focusing lens 13 on a desired reading area (wherein, for example, an optical code to be identified is present). On the other hand, with reference to FIG. 4, chip 4 of the laser diode 20 generates a laser beam (unillustrated in FIG. 4) which is suitably stopped and focused by the window/diaphragm/lens 13 on a desired reading area (wherein, for example, an optical code to be identified is present). When device 1 is used in an optical reader, the luminous signal diffused by the illuminated optical code is detected by the photo-detecting means arranged in the same reader, and afterwards it is processed to acquire the desired information. In the specific case of an optical code reader, the luminous signal is detected as analogue electrical signal, converted into digital and then decoded.

Figure 6:
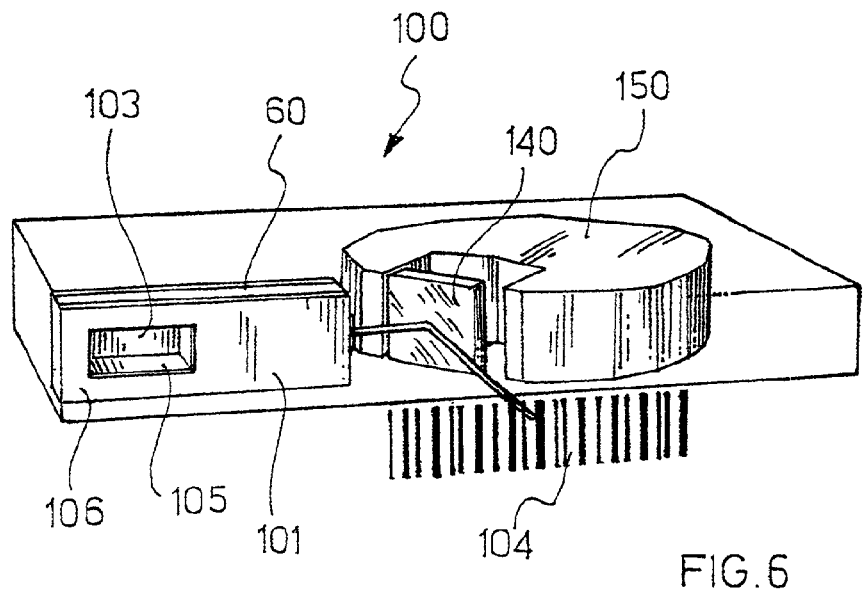
FIG. 6 shows a perspective, schematic and sectioned view of an emission/detection device according to the present invention.
Figure 7:
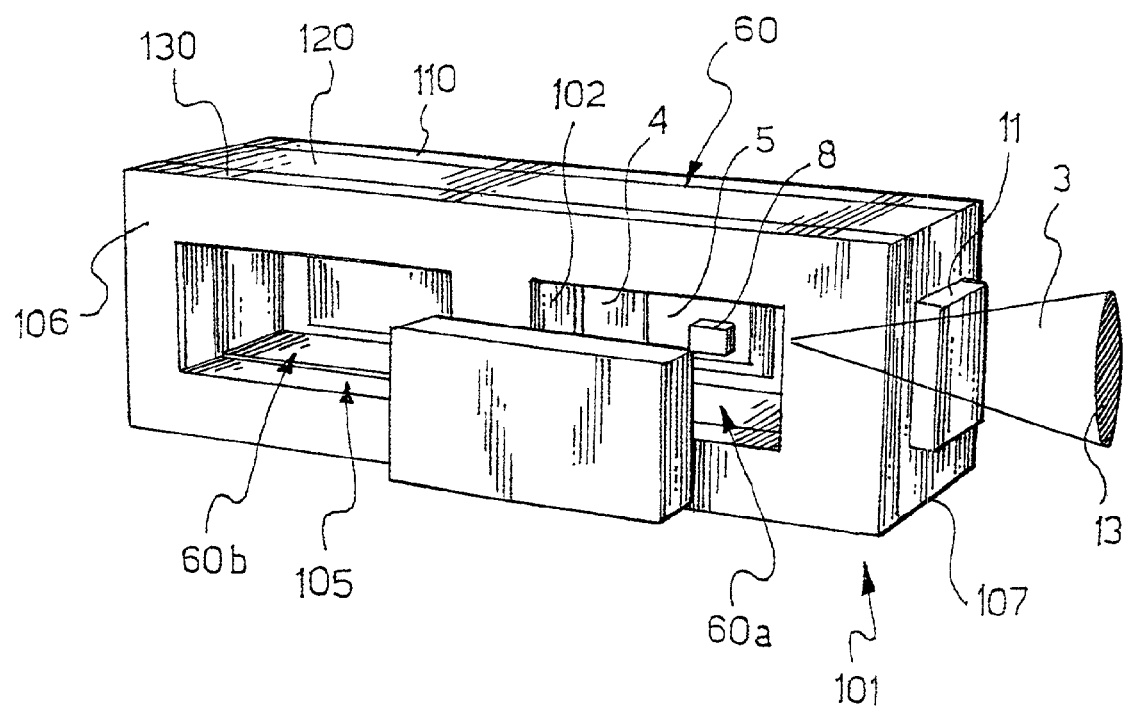
FIG. 7 shows a front, perspective, schematic and sectioned view of a portion of the device of FIG. 6.
Figure 8:
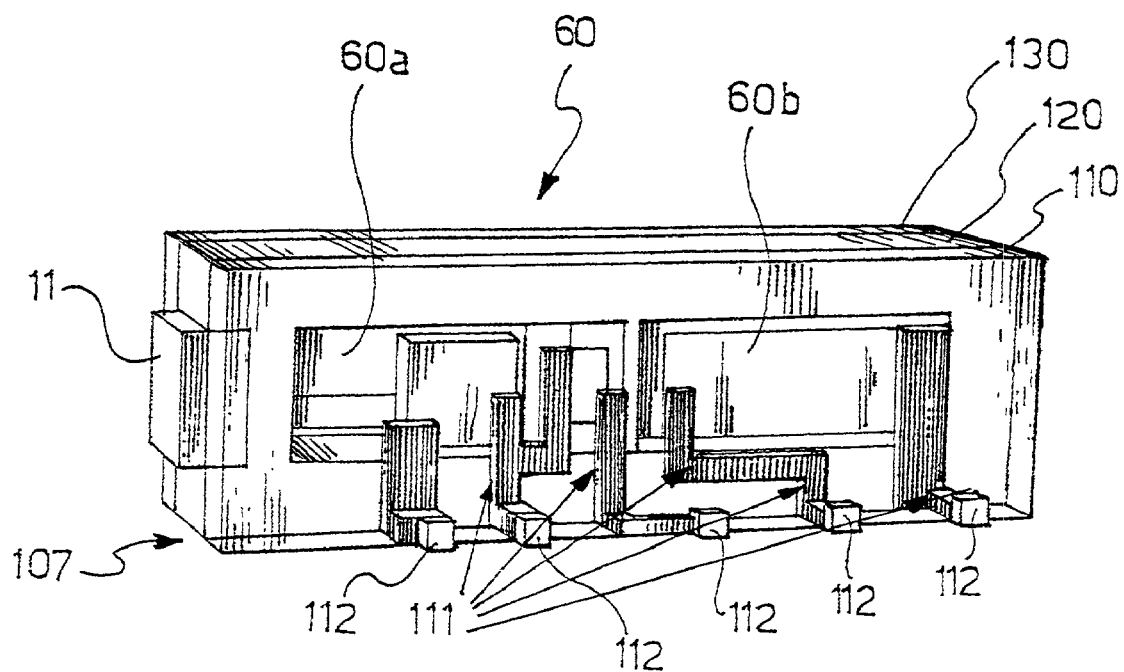
FIG. 8 shows a rear, perspective, schematic and sectioned view of the portion of FIG. 7.

Reference shall now be made to FIG. 6, FIG. 7, and FIG. 8, which show a non-retroreflective scan optical reader 100 comprising an optical emission/detection device 101 of a luminous signal in accordance with the present invention. From the structural point of view, said device 101 is substantially equal to the conventional emission source 2 shown in FIG. 1 (or, in some of its alternative embodiments, to the emission device shown in FIG. 2, FIG. 3, or FIG. 4), with the exception of package 60. In the device 101, the package 60 (shown in more detail in FIG. 7) has a substantially parallelepipedal shape. The cavity of package 60 is divided into two portions 60a and 60b optically separated by an intermediate wall 102 made of an optically opaque material.

Portion 60a of package 60 houses the means for generating the light beam described above with reference to FIG. 1. Portion 60b houses a photodiode 103 for collecting and detecting the luminous beam diffused by an optical code 104 illuminated by the above means for generating the light beam 3 (see FIG. 6).

Portion 60b is provided with a window 105 for collecting the light beam diffused by the optical code 104. Window 105 is formed on a wall 106 substantially orthogonal to wall 107 on which the window 11 for the emission of the light beam 3 is formed (in other words, wall 107 is substantially parallel to the code plane 104).

The light beam 3 generated in the device 101 impinges at 45° on a rotating or oscillating mirror 140 of a mirror polygonal rotor 150. The rotor 150 generates a scan in a substantially orthogonal direction with respect to the emission direction of light beam 3. Beam 3 thus deviated impinges on the optical code 104, and the light diffused thereby (by optical code 104) is collected by the photodiode 103. Therefore, the emission and collecting optical paths are totally separate from one another.

FIG. 7 and FIG. 8 show in detail the internal structure of this device. Package 60, made of a plastic, metal or ceramic material, essentially comprises three layers (however, there could also be only two layers. The first layer, referred to with reference numeral 110, is the base layer wherein some tracks 111 for connecting the photodiode contacts 112 are formed. Onto base 110 there are mounted the monitor photodiode 8, the chip 4 of the laser diode, and the reception photodiode 103. The chip 4 of the laser diode can be of the side emission type, SEL, or vertical emission, VCSEL and is mounted on a support 5 made of a thermally conductive material (see FIG. 7). Then, on the first layer 110 a second layer 120 is mounted, wherein the window 11 is formed (see FIG. 8). Optionally, the window 11 may act as diaphragm 12 or as diaphragm/lens 13, as described above. The layer 120 concurrently serves as spacer between the layer 110 and a third layer 130. In the third layer 130 the window 105 (formed of transparent material) for collecting the light beam diffused by the illuminated optical code 104 is formed. The reception photodiode 103 is thus in a slightly rear position with respect to the gathering window 105, and therefore it is partly screened with respect to the light coming from different areas than that illuminated by the emission beam (ambient light), thus improving the signal-noise ratio at the output from photodiode 103.

The intermediate wall 102 is made of an optically opaque material to prevent the reception photodiode 103 from being even slightly impinged by the light beam 3 emitted by the laser diode. Such impingement would cause undesired noise in the output signal. Thus, the optical emission path is optically insulated from the optical reception path.

All the remarks made above with reference to the different embodiments of device 1 of the present invention are totally applicable to device 101 described above (with particular reference to the presence of a diaphragm and/or of a focusing lens, which may be or may be not integrated in the package 60).

The invention claimed is:

1. An optical device for emitting a laser light beam, comprising:
   a light beam emission source including a protective and/or insulating package and means for generating the laser light beam housed within the package, the package being provided with a laser light beam emission window;
   wherein the package comprises a diaphragm which defines an aperture for selecting a central portion of the generated laser light beam so that the selected central portion of the generated laser light beam is propagated out of the package and has predetermined diffraction pattern, while propagation of the remaining portion of the generated laser light beam is obstructed; wherein only the selected central portion of the generated laser light beam passes through said emission window.

2. The device according to claim 1, wherein the source comprises a semiconductor laser diode.

3. The device according to claim 1, wherein said diaphragm is directly associated to said package at said laser light beam emission window.

4. The device according to claim 3, wherein said diaphragm is directly housed in the laser light beam emission window.

5. The device according to claim 1, wherein said laser light beam emission window is shaped to serve as the diaphragm.

6. The device according to claim 1, wherein a size of the laser light beam emission window is smaller than a size of the laser light beam in a transversal cross section taken at said laser light beam emission window.

7. The device according to claim 1, wherein said aperture has a Fresnel number smaller than 2 along a predetermined reading direction.

8. The device according to claim 7, wherein said aperture has a Fresnel number smaller than 1.2 along said reading direction.

9. The device according to claim 1, wherein said aperture has a Fresnel number smaller than 2 along an orthogonal direction with respect to a predetermined reading direction.

10. The device according to claim 1, further comprising a focusing lens.

11. The device according to claim 10, wherein the focusing lens is directly associated to said package at said laser light beam emission window.

12. The device according to claim 11, further comprising an adhesive interposed between the focusing lens and the laser light beam emission window.

13. The device according to claim 11, wherein the focusing lens is housed in the laser light beam emission window and serves as the diaphragm.

14. The device according to claim 13, wherein the focusing lens is one of a Fresnel and a diffractive lens.

15. The device according to claim 1, wherein said package exhibits a longitudinal axis Z and wherein the source is arranged in said package so that the emitted light beam propagates along a substantially perpendicular direction with respect to said longitudinal axis Z.

16. An optical reader, comprising:
   a laser light beam emission device for illuminating an optical code,
   means for generating at least one scan of said optical code,
   photo-detecting means which collects a luminous signal diffused by the illuminated optical code and generates an electrical signal proportional thereto, and
   processing means for processing the electrical signal,
   wherein the laser light beam emission device comprises:
      a laser light beam emission source including a protective and/or insulating package and means for generating a laser light beam housed within the package, the package being provided with a laser light beam emission window;
      wherein the package comprises a diaphragm which defines an aperture for selecting a central portion of the generated laser light beam so that the selected central portion of the generated laser light beam is propagated out of the package and has a predetermined diffraction pattern, while propagation of the remaining portion of the generated laser light beam is obstructed;
      wherein only the selected central portion of the generated laser light beam passes through said emission window.

17. A protective and/or insulating package for a light beam emission source, the package comprising:
   means for generating a light beam housed in a cavity of the package,
   a wall provided with a window which allows emission of the light beam, and
   a diaphragm which defines an aperature intended to select a central portion of the generated light beam so that the selected central portion of the generated laser light beam is propagated out of the package and has a predetermined diffraction pattern, while propagation of the remaining portion of the generated laser light beam is obstructed, wherein only the selected central portion of the generated laser light beam passes through said emission window.

18. An optical device for emitting/detecting a luminous signal, comprising:
   a light beam emission source including a protective and/or insulating package and means for generating the light beam housed in a first portion of the package, a light beam emission window being formed in the first portion of the package;
   photo-receiving means for detecting a luminous signal diffused by an optical code illuminated by the emission source, the photo-receiving means being housed in a second portion of the package, the second portion of the package being optically separate with respect to the first portion, the second portion of the package being provided with a window for collecting the luminous signal diffused by the illuminated optical code, said emission and collecting windows being formed on respective first and second walls of the package which lie on different planes.

19. The device according to claim 18, wherein the emission source comprises a semiconductor laser diode.

20. The device according to claim 18, wherein said first and second walls are orthogonally oriented with respect to one another.

21. The device according to claim 18, wherein said protective and/or insulating package comprises at least one diaphragm intended to select a central portion of the generated light beam.

22. The device according to claim 21, wherein said diaphragm is directly associated to said package at said light beam emission window.

23. The device according to claim 22, wherein said diaphragm is directly housed in the light beam emission window.

24. The device according to claim 22, wherein said light beam emission window is shaped to serve as said diaphragm.

25. The device according to claim 18, wherein a size of the light beam emission window is smaller than a size of the light beam in a transversal cross section taken at said light beam emission window.

26. The device according to claim 21, wherein said diaphragm defines an aperture having a Fresnel number smaller than 2 along a predetermined reading direction.

27. The device according to claim 26, wherein said aperture has a Fresnel number smaller than 1.2 along said reading direction.

28. The device according to claim 21, wherein said diaphragm defines an aperture having a Fresnel number smaller than 2 along an orthogonal direction with respect to a determined reading direction.

29. The device according to claim 18, also comprising a focusing lens.

30. The device according to claim 29, wherein the focusing lens is directly associated to said package at said light beam emission window.

31. The device according to claim 30, further comprising an adhesive interposed between the focusing lens and the light beam emission window.

32. The device according to claim 30, wherein the focusing lens is housed in the light beam emission window and serves as the said diaphragm.

33. The device according to claim 32, wherein the focusing lens is one of a Fresnel and a diffractive lens.

34. The device according to claim 18, further comprising a wall made of an optically opaque material interposed between said first portion of the package and the second portion of the package.

35. An optical reader comprising:
a light beam emission device which generates a light beam for illuminating an optical code,
means for generating a scan of the optical code,
a device for detecting the luminous signal diffused by the illuminated optical code and for generating an electrical signal proportional thereto,
means for processing the electrical signal,
wherein the emission device and the detection device are integrated in a single device, the single device comprising a source of light beam including a protective and/or insulating package and means for generating the laser light beam housed within the package, the package being provided with a laser light beam emission window;
wherein the package comprises a diaphragm which defines an aperture for selecting a central portion of a generated laser light beam so that the selected central portion of the generated laser light beam is propagated out of the package and has a predetermined diffraction pattern, while propagation of the remaining portion of the generated laser light beam is obstructed;
wherein only the selected central portion of the generated laer light beam passes through said emission window.

36. A protective and/or insulating package for a light beam emission source, comprising:
a first portion which houses means for generating a light beam, the first portion being provided with a first wall wherein there is formed a window which allows emission of the light beam,
a second portion which houses photo-receiving means for detecting a luminous signal diffused by an optical code illuminated by the light beam generating means, the second portion being provided with a second wall, a window for collecting the luminous signal diffused by the illuminated optical code being formed in the second wall, the second portion being optically separate from the first portion, said first and second walls laying on respective different planes.

37. An optical reader comprising:
a light beam emission device which generates a light beam for illuminating an optical code,
means for generating a scan of the optical code,
a device for detecting the luminous signal diffused by the illuminated optical code and for generating an electrical signal proportional thereto,
means for processing the electrical signal,
wherein the emission device and the detection device are integrated in a single device, the single device comprising a source of the light beam including a protective and/or insulating package, means for generating the light beam housed in a first portion of the package, a light beam emission window being formed in the first portion of the package, and photo-receiving means which detects a luminous signal diffused by an optical code illuminated by the source, the photo-receiving means being housed in a second portion of the package, the second portion of the package being optically separate with respect to the first portion, the second portion of the package being provided with a window for collecting the luminous signal diffused by the illuminated optical code, said emission and collecting windows being formed on respective first and second walls of the package which lie on different planes.

* * * * *